Figure 1:
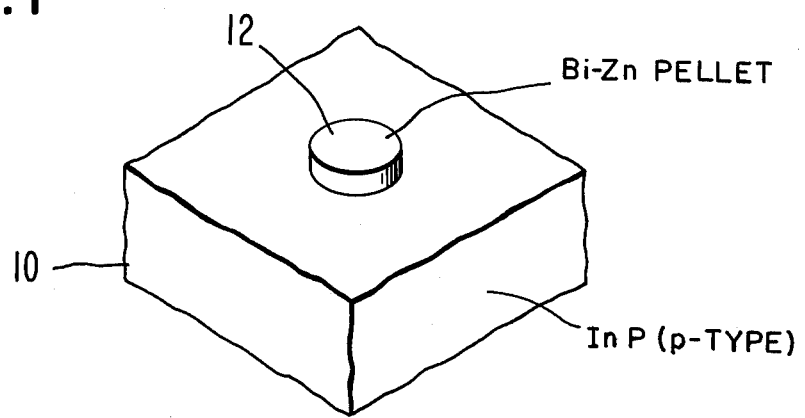

United States Patent
Moon

[11] 4,025,944
[45] May 24, 1977

[54] OHMIC CONTACTS TO p-TYPE INDIUM PHOSPHIDE

[75] Inventor: Ronald L. Moon, Menlo Park, Calif.

[73] Assignee: Varian Associates, Palo Alto, Calif.

[22] Filed: Apr. 5, 1976

[21] Appl. No.: 673,781

[52] U.S. Cl. .................................. 357/67; 357/61; 148/185
[51] Int. Cl.² ............... H01L 29/161; H01L 23/48; H01L 29/46; H01L 7/46
[58] Field of Search ............................ 357/61, 67

[56] References Cited
UNITED STATES PATENTS

| 3,638,304 | 2/1972 | Bleil | 357/67 |
| 3,863,334 | 2/1975 | Coleman | 357/67 |

Primary Examiner—Edward J. Wojciechowicz
Attorney, Agent, or Firm—Stanley Z. Cole; Robert K. Stoddard; Richard B. Nelson

[57] ABSTRACT

A body of p-type indium phosphide, which was heretofore difficult to contact in a reliable low resistance manner, is ohmically contacted by an alloy contact of bismuth with preferably 2% zinc. The alloy contact is effected by placing a small pellet of the Bi-Zn alloy on the surface of the p-type InP body and then alloying at a preferred temperature of 360° C for 20 seconds.

15 Claims, 2 Drawing Figures

OHMIC CONTACTS TO p-TYPE INDIUM PHOSPHIDE

BACKGROUND--FIELD OF INVENTION

This invention relates to semiconductor devices and particularly to the making of ohmic contacts to a body of p-type indium phosphide.

BACKGROUND--DESCRIPTION OF PRIOR ART

In the past, it has been difficult to make ohmic contact to p-type indium phosphide. This is because when it was attempted to contact indium phosphide, a rectifying or Schottky barrier junction was produced, or the contact, although ohmic, has very high resistance.

In 18 Solid State Electronics 541 (1975) there is a review of the subject of making ohmic contacts to bodies of semiconductive material formed of elements selected from columns III and V of the Periodic Table, such as gallium, arsenic, indium, and phosphorus. This reference suggests only indium as a contact material for p-type indium phosphide. However the present inventor and others have attempted to make contacts to p-type indium phosphide with indium, but, more often than not, such contacts exhibit a non-ohmic (rectifying) character, despite the exercise of careful control in the fabrication thereof.

Recently, Schiavone and Pritchard, 46 Journal of Applied Physics 452 (1975), used an electroplating method whereby Au-Zn-Au layers were sequentially desposited on p-type InP crystals. Following the electrochemical deposition these layers were sintered at 475° Centigrade for 15 seconds in an atmosphere of forming gas. Ohmic contacts were observed. Although this method appears to work, the procedure is somewhat awkward and time consuming.

Contacts to p-type InP have also been attempted using indium-zinc, gold-zinc, and gold-magnesium alloys, but these also made erratic contacts to p-type indium phosphide. None of the known contacts, or their analogs, to n-type InP, such as tin or a gold-germanium-nickel alloy, have been found suitable for p-type InP.

Since p-type indium phosphide is rapidly becoming a useful microwave and optoelectronic material — e.g., it is being used in or recommended for avalanche diodes, component layers of photovoltaic cells, solid state lasers, and photocathodes — is very desirable that a simple, reliable means of forming ohmic contacts to p-type indium phosphide be provided.

Accordingly, objects of the present invention are to provide reliable, reproducible, ohmic, low resistance contacts to p-type indium phosphide. Other objects and advantages will become apparent from a consideration of the ensuing description.

DRAWINGS

Figure 2:
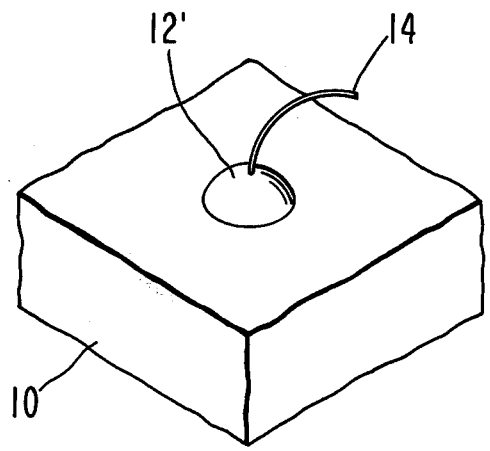

FIG. 1 is a perspective view of a body of indium phosphide with a contact pellet thereon, and FIG. 2 shows said body of indium phosphide with the contact pellet and a lead wire bonded thereto.

DESCRIPTION

According to the invention a p-type body of indium phosphide 10 is contacted by using a pellet of bismuth zinc alloy 12.

InP body 10 may be a substrate of a more complex device containing overlying epitaxial layers or may be an epitaxial layer itself. It is shown in partial form only in order to indicate that the invention is not limited to any particular type or shape of indium phosphide body.

Body 10 had the crystallographic face (111)B and was made p-type by doping with zinc to have about $2 \times 10^{18}$ dopant atoms per cubic centimeter (da/cc). An alternative body was zinc-doped to a lower concentration, $1 \times 10^{15}$ dopant atoms per cubic centimeter.

The (111)B surface of the body where the alloy contact is to be made was thoroughly cleaned using standard semiconductor wafer cleaning processes. Pellet 12 of a bismuth-zinc alloy having 2% by weight of zinc was placed on the surface of body 10 after cleaning. Such a pellet can have a diameter of about 1.6 mm (1/16th inch) and a thickness of from 125–500 microns (5–20 mils).

Next, the pellet and at least the adjacent surface of body 10 were alloyed by placing them in an ambient temperature of 360° C for 20 seconds. This causes the pellet to melt and alloy with the surface of body 10, effecting an ohmic contact therewith. The pellet will assume a hemispherical or dome shape due to surface tension, as indicated at 12' in FIG. 2.

Next a lead wire 14 of gold or nickel about 125 microns (5 mils) in diameter is pressed against pellet 12' and embedded therein by repeating the former heat step. Thereafter the device is cooled, thereby effecting firm bond between 12' and 14.

As is well known, the other end of lead wire 14 may be attached to an external circuit through the use of the usual contacts or other means.

The step of heat-treating pellet 12 to alloy it to body 10 should be performed in a reducing atmosphere such as hydrogen to avoid oxidation of the metal alloy or substrate.

If it is desired that the alloy pellet of bismuth-zinc not take the dome-shaped form shown at 12', a graphite press plate can be provided over pellet 12 during the heating step so that upon cooling the alloy pellet will have the same shape as before heating.

While I do not wish to be limited thereto, I theorize that during the heat step, the firm bond is effected as follows: Part of the indium phosphide dissolves in and saturates the bismuth. Upon cooling, the solubility of indium phosphide in bismuth is less than that in the liquid state so that p-type indium phosphide as caused by the dopant precipitates out and in doing so effects a firm bond between substrate 10 and the pellet.

I have made current-versus-voltage tests of bismuth-zinc pellets as shown alloyed to either heavily or lightly doped p-type indium phosphide bodies as above described and have found that such curves were perfectly linear over the usable voltage-current range, thereby indicating a purely ohmic connection.

While the invention works most satisfactorily with bismuth containing about 2% by weight of zinc, other percentages of zinc in an amount effective to provide ohmic contacts to p-type InP are also acceptable, i.e., concentration ranges where a solid solution is formed between the Zn and Bi elements, namely trace amounts to about 3% Zn, are also encompassed, as are larger concentration ranges of Zn, which form two-phase solids with Bi. In lieu of Zn, other p-type dopants such as Mg, Cd, or Be can be alloyed with Bi within the scope of the invention.

Regarding the alloy temperature, I have found that placing body 10 with pellet 12 thereon in an alloying ambient having a temperature of 360° C for 20 seconds is most suitable, but do not wish to rule out the possibility that higher "flash" temperatures for much briefer periods of time may be employed, or substantially lower temperatures for extended periods of time may be employed. However the time and temperature during alloying must be carefully selected since I have observed that, with the preferred percentages and materials aforementioned, if the alloying temperature is raised by only 40° C, namely to 400° C, for the 20-second interval, non-ohmic contacts generally result.

While the above description includes many specifities, these should not be construed as limitations upon the scope of the invention, but rather as an exemplification of several preferred embodiments thereof. The invention is capable of being performed in other ways, for example by making an alloy connection to an entire surface of the p-type InP body, as would be done when an InP substrate is to be bonded to a lead. Therefore the true scope of the invention is intended to be indicated only by the language of the appended claims and their legal equivalents.

What is claimed is:

1. A body of p-type indium phosphide having an ohmic contact to a surface therof, said ohmic contact comprising a body of bismuth alloyed with a small percentage of an element selected from the class consisting of zinc, magnesium, cadmium and beryllium in an amount effective to permit alloying of said body to said contact to form a substantially ohmic connection.

2. The invention of claim 1 wherein said body of p-type indium phosphide is doped with zinc to a concentration of about $2 \times 10$ to the 18th power dopant atoms per cubic centimeter.

3. the invention of claim 1 wherein said body of p-type indium phosphide is doped with zinc to a concentration of about 10 to the 15th power dopant atoms per cubic centimeter.

4. The invention of claim 1 wherein said element is zinc and the percentage of zinc in said body of bismuth is about two percent by weight.

5. The invention of claim 1 wherein said element is zinc and the percentage of zinc in said body of bismuth is within the range from a trace amount to about three percent by weight.

6. The invention of claim 1 wherein said element is zinc and the percentage of zinc in said body of bismuth is within the range which forms a solid solution with bismuth.

7. The invention of claim 1 further including a wire lead embedded in said ohmic contact.

8. A process for making an ohmic contact to a body of p-type indium phosphide, comprising placing a body of bismuth alloyed with a percentage of an element selected from the class consisting of zinc, magnesium, cadmium and beryllium in an amount effective to permit alloying of said indium phosphide body to said contact to form a substantially ohmic connection on a surface of said indium phosphide body and heating said body of bismuth alloy and the adjacent surface of said indium phosphide body sufficiently to alloy said bismuth alloy to said indium phosphide body without forming a rectifying junction therebetween.

9. The process of claim 8 wherein said heating is carried out at a temperature of about 360° centigrade for about twenty seconds.

10. The process of claim 8 wherein said body of p-type indium phosphide is doped with zinc to a concentration of about $2 \times 10$ to the 18th power dopant atoms per cubic centimeter.

11. The process of claim 8 wherein said body of p-type indium phosphide is doped with zinc to a concentration of about 10 to the 15th power dopant atoms per cubic centimeter.

12. The process of claim 8 wherein said element is zinc and the percentage of zinc in said body of bismuth is about two percent by weight.

13. The process of claim 8 wherein said element is zinc and the percentage of zinc in said body of bismuth is within the range from a trace amount to about three percent by weight.

14. The process of claim 8 wherein said element is zinc and the percentage of zinc in said body of bismuth is within the range which forms a solid solution with bismuth.

15. The process of claim 8, further including the step of embedding a wire lead in said alloy of bismuth.

* * * * *